(12) United States Patent
Saed

(10) Patent No.: US 9,363,046 B1
(45) Date of Patent: Jun. 7, 2016

(54) MEASURING IMPAIRMENTS OF DIGITIZED SIGNALS IN DATA AND TIMING RECOVERY CIRCUITS

(71) Applicant: PMC-Sierra US, Inc., Sunnyvale, CA (US)

(72) Inventor: Aryan Saed, Port Coquitlam (CA)

(73) Assignee: Microsemi Storage Solutions (U.S.), Inc., Aliso Viejo, CA (US)

( * ) Notice: Subject to any disclaimer, the term of this patent is extended or adjusted under 35 U.S.C. 154(b) by 0 days.

(21) Appl. No.: 14/323,856

(22) Filed: Jul. 3, 2014

Related U.S. Application Data

(62) Division of application No. 13/479,733, filed on May 24, 2012, now Pat. No. 8,855,179.

(51) Int. Cl.
*H04L 1/24* (2006.01)

(52) U.S. Cl.
CPC ........................................ *H04L 1/24* (2013.01)

(58) Field of Classification Search
USPC .......................................... 375/224, 356, 376
IPC ............... H04L 7/0025,7/0029, 7/0331, 7/0008
See application file for complete search history.

(56) References Cited

U.S. PATENT DOCUMENTS

| 5,892,632 | A * | 4/1999 | Behrens et al. .................. 360/51 |
| 7,522,661 | B2 | 4/2009 | Nelson et al. |
| 7,606,297 | B2 | 10/2009 | Waschura et al. |
| 7,684,478 | B2 | 3/2010 | Cranford, Jr. et al. |
| 7,792,649 | B2 | 9/2010 | Cranford, Jr. et al. |
| 7,822,110 | B1 | 10/2010 | Doblar |
| 7,957,923 | B2 | 6/2011 | Chao et al. |
| 2003/0123594 | A1 | 7/2003 | Glenn et al. |
| 2005/0149801 | A1 | 7/2005 | Oshima |
| 2005/0265504 | A1 | 12/2005 | Robinson et al. |
| 2007/0018704 | A1 | 1/2007 | Ishii et al. |
| 2009/0252265 | A1 * | 10/2009 | Xia et al. ...................... 375/355 |

OTHER PUBLICATIONS

U.S. Appl. No. 14/755,234, Office Action dated Aug. 13, 2015.

* cited by examiner

*Primary Examiner* — Kabir A Timory
(74) *Attorney, Agent, or Firm* — Dennis R. Haszko

(57) ABSTRACT

On-chip at-speed eye measurements of digitized signals in data and timing recovery circuits are disclosed. Eye diagrams and jitter measurements are used to evaluate signal quality and bath-tub Bit Error Rate characteristics in baseband communication systems. This disclosure describes a method and apparatus for digitally sampling a received signal at speed to produce an eye diagram of the received signal. This involves adding a small amount of circuitry to the existing prior art systems that use an interpolator for timing recovery and data recovery. In the present disclosure a temporary offset is applied to the interpolation index of the interpolator to obtain interpolated samples between the baud center and baud edge. The eye diagram can be produced from the received digitized and interpolated signal before equalization, or alternatively from the equalized signal.

18 Claims, 6 Drawing Sheets

MEASURING IMPAIRMENTS OF DIGITIZED SIGNALS IN DATA AND TIMING RECOVERY CIRCUITS

CROSS-REFERENCE TO RELATED APPLICATIONS

This application is a divisional of U.S. application Ser. No. 13/479,733 filed May 24, 2012, now U.S. Pat. No. 8,855,179, issued Oct. 7, 2014, which is incorporated herein by reference.

FIELD

The present disclosure relates to signal processing in data networking and communications applications, and more specifically to serializer/deserializer (SERDES) devices for electrical lines used in data communications at any line rate.

BACKGROUND

Baseband communications systems involve the transmission of bits over an electrical or optical line. The transmitter sends the data bits in one of several formats, such as PAM (Pulse Amplitude Modulation) or NRZ (Non-Return to Zero) modulation. Modern systems carry data bits of multiple Gigabit rates over electrical wire, back planes, board traces and/or over optical fibers. Examples are SAS and SATA disk data transfer protocols operating at 1.5 Gbps, 3.0 Gbps, 6 Gbps and 12 Gbps.

When the data bits are carried over the electrical or optical media, the signal is impaired by several effects. These include, among others: power supply noise; cross talk; frequency dependence of the channel transfer function; DC offset; and clock jitter, clock frequency, and phase offsets at the transmitter and receiver. It is the task of the receiver to recover the transmitted bits from the impaired received signal.

In receivers of SERDES systems, the high-speed line signal is sampled serially and the recovered bits are output in groups, in parallel, at a lower rate. For instance a SERDES for a 6 Gbps line rate might sample the line rate at 6 Gbps and output the recovered data to a 10-bit bus at 600 MHz or a 20-bit bus at 300 MHz.

In most analog SERDES receivers, the local bit recovery clock is carefully and precisely synchronized with the baud rate of the received signal. Then, at each receiver clock cycle, the signal is sampled at the center of the baud to recover the transmitted bit. Additional equalization may be applied to undo some of the channel distortion and to improve the BER (Bit Error Rate).

In most DSP (Digital Signal Processing) based asynchronous SERDES receivers, the local bit recovery clock is not synchronized, and instead the received analog signal is first sampled and digitized at the ADC (Analog to Digital Converter) using the DSP clock. A DSP interpolator is applied to recover the data bits, and its interpolation index is calculated by a DSP based TR (Timing Recovery) circuit. To this end the received signal is sampled at a rate higher than the baud rate. The over sampling rate may be 1.5×, 2×, 3× or even 4× depending on the desired interpolation and timing tracking performance at the given signal impairments. Typically the asynchronous DSP clock frequency may be several hundreds or even thousands of ppm (Parts per Million) offset from the transmit clock.

To perform the data recovery, the TR supplies a regularly updated interpolation index to the interpolator, which calculates the signal amplitude at that index. This calculated signal amplitude is then used to recover the transmitted data bit. Often this simply involves determining the sign of the interpolated signal at the desired interpolation index. In some systems an equalizer may be applied, which calculates an equalized amplitude from the interpolated amplitude. The equalizer may comprise a FFE (Feed Forward Equalizer) and/or a DFE (Decision Feedback Equalizer).

In many applications, the electrical distortion and other impairments of the received signal are not fixed and pre-determined but rather depend on use, application, deployment and other time varying factors such as temperature. To this end the equalizer will apply adapted coefficients.

When the final SERDES system is validated, it is assessed in terms of its tolerance to SJ (Sinusoidal jitter) under various operating conditions. This is a characterization based on the BER (Bit Error Rate) of the received signal. While the SJ characterization provides a measure for timing tracking in the presence of frequency offset and other timing jitter, it does not provide detailed insight into the causes of any low performance, whether in experimental or production systems.

When the SERDES system is implemented with an ASIC (Application Specific Integrated Circuit), in known approaches these measurements are performed at the input to the ASIC, as there is generally no ability to probe into the ASIC. As a result, the probed signal represents the impaired signal at the input to the ASIC. Any additional impairments originating within the ASIC are not represented. Moreover, any processing performed within the ASIC is also not represented.

Moreover, these measurements require costly measurement equipment that is not always readily available when poor performance requires deeper investigation of the received signal. These measurements are also cumbersome to set-up and difficult to use at a customer site or by the customer.

Improvements in the measurement of impairments of the received signal are desirable.

BRIEF DESCRIPTION OF THE DRAWINGS

Embodiments of the present disclosure will now be described, by way of example only, with reference to the attached Figures.

DETAILED DESCRIPTION

Figure 1:
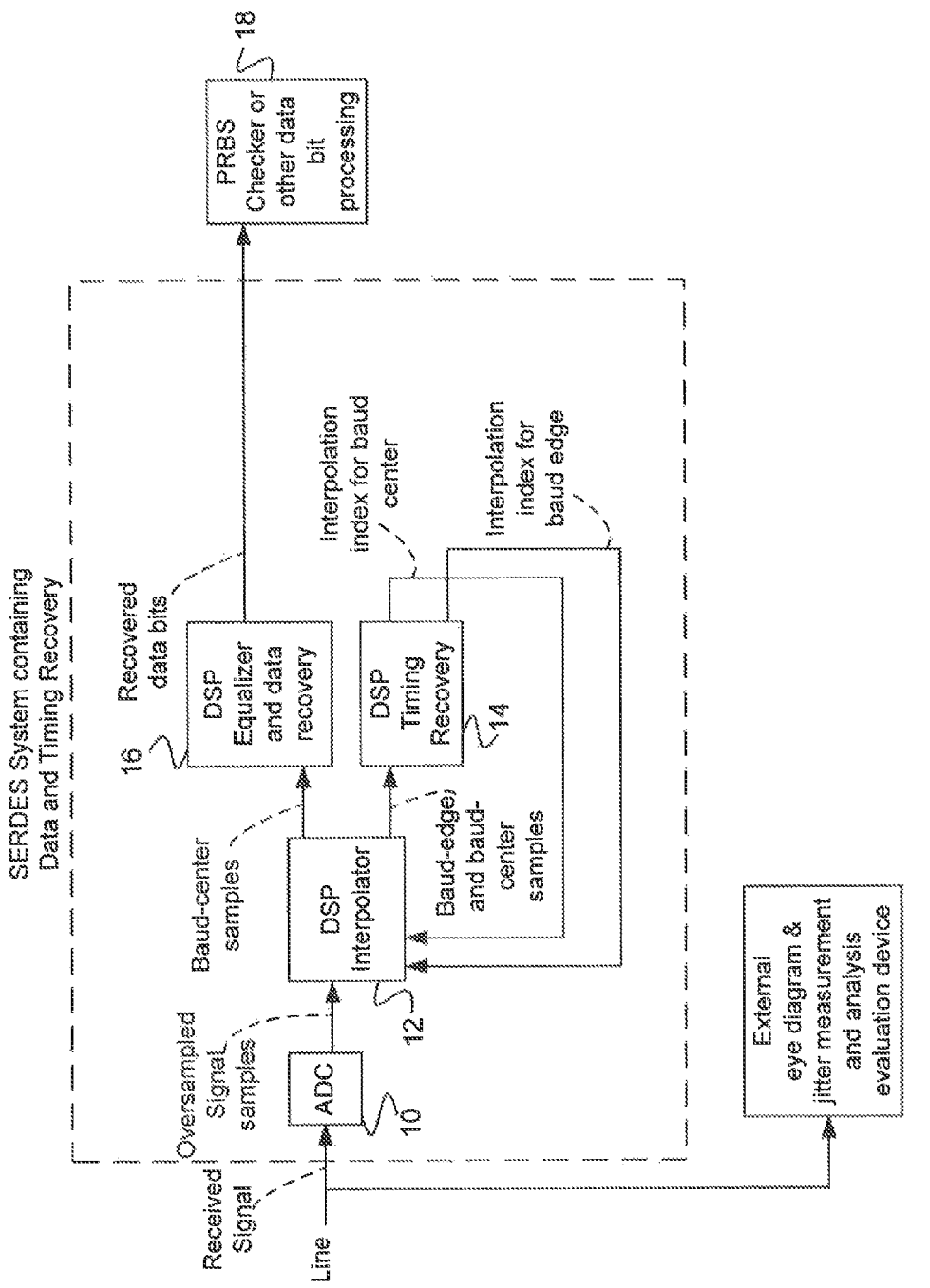
FIG. 1 illustrates a known approach to data and timing recovery in a SERDES system.

On-chip at-speed eye measurements of digitized signals in data and timing recovery circuits are disclosed. Eye diagrams and jitter measurements are used to evaluate signal quality and bath-tub Bit Error Rate characteristics in baseband communication systems. This disclosure describes a method and apparatus for digitally sampling a received signal at speed to produce an eye diagram of the received signal. This involves adding a small amount of circuitry to the existing systems that use an interpolator for timing recovery and data recovery.

"At-speed" measurements are performed at the same rate, or substantially the same rate, at which a signal is received. For example, measurements are performed at a line rate, or baud rate or baud speed, without sub-sampling at a lower rate. Measurements are said to be "on-chip" or "within the DSP based circuit" when they are performed within DSP data and timing recovery circuitry, or within a SERDES system or ASIC in which the DSP timing and recovery circuitry is provided. This is in contrast to measurement and analysis performed externally, such as using costly specialized measurement equipment.

In known approaches, the interpolator supplies baud-center samples for data recovery, and edge samples for timing recovery. In the present disclosure a temporary offset is applied to the interpolation index of the interpolator to obtain interpolated samples between the baud center and baud edge. In one embodiment the baud-center sampling is maintained while the baud-edge sampling is offset. In another embodiment the baud-edge sampling is maintained while the baud-center is offset. The offset samples are sampled at baud speed and collected in two dimensional histogram bins. From time to time, at a rate much lower than the baud rate, the contents of the bins are processed to produce two dimensional eye diagrams. The eye diagram can be produced from the received digitized and interpolated signal before equalization, or alternatively from the equalized signal.

The present disclosure involves an alternate method, when compared to known approaches, to measure a received signal and to provide insight in the impairments of the received and recovered signal.

In an embodiment, the present disclosure provides an asynchronous DSP based data and timing recovery circuit, comprising: DSP interpolator and timing recovery circuitry configured to calculate amplitude values for data and timing recovery and to calculate an interpolation index; and a control circuit, in communication with the DSP interpolator and timing recovery circuitry, configured to switch the DSP interpolator and timing recovery circuitry between a first mode in which baud-center samples are provided for data recovery and edge samples are provided for timing recovery, and a second mode in which a temporary offset is applied to the interpolation index to produce offset interpolated samples between the baud center and baud edge. The offset interpolated samples enable measurement of signal impairments within the DSP based circuit. The first mode is a data and timing recovery mode, and the second mode is a diagnostic mode.

In an example embodiment, the offset interpolated samples, produced under the control of the control circuit, enable measurement of signal impairments at the same rate at which a signal is received.

In an example embodiment, the circuit further includes an alternate index calculator, in communication with the control circuit to receive the temporary offset, and in communication with the DSP interpolator and timing recovery circuitry to receive the interpolation index. The alternate index calculator is configured to generate the offset interpolated samples based on the temporary offset and the interpolation index. In an example embodiment, the circuit further includes a multiplexer, in communication with the control circuit to receive a selection signal, and in communication with the alternate index calculator to receive the offset interpolated samples. The multiplexer is further in communication with the DSP interpolator and timing recovery circuitry to output an offset interpolation index in response to the selection signal.

In an example embodiment, the circuit further includes a histogram unit, in communication with the control unit and with the DSP interpolator and timing recovery circuitry, for collecting the calculated amplitude when the interpolator index is overridden.

In another embodiment, the present disclosure provides a method for measuring signal impairments in a received signal in an asynchronous DSP based data and timing recovery circuit, comprising: generating an offset value; applying the offset value to an interpolation index to obtain, at a baud speed of the received signal, offset interpolated samples between a baud centre and a baud edge; and determining, within the DSP based data and timing recovery circuit, signal characteristics in the received signal based on the offset interpolated samples. In an example embodiment, the signal characteristics comprise signal amplitude.

In an example embodiment, applying the offset to the interpolation index comprises offsetting a baud-edge sampling, while maintaining a baud-center sampling without offset. In another example embodiment, applying the offset to the interpolation index comprises offsetting a baud-center sampling, while maintaining a baud-edge sampling without offset.

In an example embodiment, determining signal impairments further includes processing the offset interpolated samples at a processing rate lower than the baud speed of the received signal. In an example embodiment, the method further includes: collecting two dimensional histogram statistics of the interpolated samples; and processing the stored offset interpolated samples at the processing rate lower than the baud speed of the received signal.

In an example embodiment, the method further includes generating an eye diagram from the received signal and the stored interpolated samples for measuring signal impairments in the received signal. In an example embodiment, the eye diagram is generated using the received signal prior to equalization, or using the received signal after equalization.

In an example embodiment, measuring signal impairments includes calculating signal jitter and bath-tub bit error rates. In an example embodiment, the offset to the interpolation index is applied in relation to properties of the received signal. In an example embodiment, the offset to the interpolation index is applied at a selected frequency and for a selected duration based on synchronization parameters of the received signal.

In another embodiment, the present disclosure provides a method for measuring signal impairments in a received signal in an asynchronous DSP based data and timing recovery circuit, comprising: providing, in a data and timing recovery mode and via DSP interpolator and timing recovery circuitry, baud-center samples for data recovery and edge samples for timing recovery; and providing, in a diagnostic mode and via the DSP interpolator and timing recovery circuitry, a temporary offset that is applied to an interpolation index to produce offset interpolated samples between the baud center and baud edge, the offset interpolated samples enabling measurement of signal impairments at a baud speed of the received signal and within the DSP based circuit.

In a further embodiment, the present disclosure provides a method of measuring signal impairments in an asynchronous DSP based data and timing recovery circuit including an interpolator circuit, comprising: calculating amplitude values for data and timing recovery; calculating an interpolation index for the interpolator circuit; and overriding the interpolation index.

In an example embodiment, the interpolation index for the data recovery is overridden. In another example embodiment, the interpolation index for the timing recovery is overridden.

In an example embodiment, the calculated amplitude is obtained at the output of the interpolator. In another example embodiment, the calculated amplitude is obtained at the output of the equalizer. In an example embodiment, the calculated amplitude is obtained at an internal node of the equalizer.

In an example embodiment, the method further includes collecting a signal amplitude when the timing control signal is overridden. In example embodiments, the signal amplitude is obtained at the output of the ADC, at the output of the equalizer, or at an internal node of the equalizer.

In an embodiment, the present disclosure provides a synchronous DSP based data and timing recovery circuit, comprising: a clock generator that is synchronized to the received signal and that produces an adjustable clock; an ADC that samples at the clock; DSP data and timing recovery circuitry configured to calculate amplitude values for data and timing recovery and to calculate a timing control signal; and a control circuit, in communication with the DSP timing recovery circuitry. The control circuit is configured to switch the DSP timing recovery circuitry between a first mode in which normal timing control samples are provided, and a second mode in which a temporary offset is applied to the timing control signal to produce offset timing control signals. The offset timing control signals enable measurement of signal impairments within the DSP based circuit. The first mode is a data and timing recovery mode, and the second mode is a diagnostic mode.

In an example embodiment, the adjustable clock produced by the clock generator comprises an adjustable phase or an adjustable frequency. In an example embodiment, the circuit further comprises: an equalizer; a multiplexer configured to receive recovered data bits from the equalizer and baud center samples from the DSP data and timing recovery circuitry, and to output a signal to sample for eye graphing; and a histogram unit, in communication with the control unit and with the multiplexer to receive the signal to sample for eye graphing, the histogram unit configured to collect a signal amplitude when the timing control signal is overridden.

In another embodiment, the present disclosure provides a DSP based data and timing recovery circuit, comprising: DSP timing recovery circuitry configured to calculate amplitude values for data and timing recovery; and a control circuit, in communication with the DSP timing recovery circuitry. The control circuit is configured to switch the DSP timing recovery circuitry between a first mode, the first mode being a data and timing recovery mode, and a second mode in which a temporary offset is applied to normal operation values to produce offset values which enable measurement of signal impairments within the DSP based circuit and at the same rate at which a signal is received, the second mode being a diagnostic mode.

In example embodiment, the normal operation values comprise timing values and wherein the offset values comprise offset timing values. In another example embodiment, the normal operation values comprise data values and wherein the offset values comprise offset data values.

In a further embodiment, the present disclosure provides a method for measuring signal impairments in a received signal in a synchronous DSP based data and timing recovery circuit, comprising: generating an offset value; applying the offset value to a timing control signal to obtain, at a baud speed of the received signal, offset timing control signals between a baud centre and a baud edge; and determining, within the DSP based data and timing recovery circuit, signal impairments in the received signal based on the offset timing control signals.

In another embodiment, the present disclosure provides a method for measuring signal impairments in a received signal in an asynchronous DSP based data and timing recovery circuit, comprising: providing, in a data and timing recovery mode and via DSP interpolator and timing recovery circuitry, baud-center samples for data recovery and edge samples for timing recovery; and providing, in a diagnostic mode and via the DSP interpolator and timing recovery circuitry, a temporary offset that is applied to a timing control signal to produce offset timing control samples between the baud center and baud edge, the offset timing control samples enabling measurement of signal impairments at a baud speed of the received signal and within the DSP based circuit.

In a further embodiment, the present disclosure provides a method of measuring signal impairments in an asynchronous DSP based data and timing recovery circuit including an interpolator circuit, comprising: calculating amplitude values for data and timing recovery; calculating a timing control signal; and overriding the timing control signal.

In known approaches, specialized measurement equipment is employed to capture and display the conditions of the received signal. This involves capturing the so called bath-tub BER curves and the eye diagrams. The bath-tub curve is a graph which shows BER against a deliberate sampling time offset. Around the center of the curve the BER is at its lowest, often reaching zero for the measurement duration, and towards either edge the BER raises, thus creating a graph resembling a bath tub. The eye diagrams as referred to in the present disclosure comprise a 2 dimensional histogram that shows a count (or statistical frequency) of a signal amplitude at a given time offset in the baud interval. Moreover, the measurement equipment can break-down the signal impairments into its constituent components in terms of types of jitter.

According to an embodiment of the present disclosure, signal impairment measurements are performed inside the SERDES itself. This provides an accurate picture of the received signal, at-speed, considering all impairments as they contribute to the BER. Such measurement can then be performed without additional costly and bulky equipment.

In many applications, SERDES power consumption and ASIC die area are constrained, and it is not desirable to add significant amounts of DSP circuitry to perform such measurements. It is therefore advantageous to implement the measurement using only little additional circuitry. Moreover, a more accurate measurement of the impairments is obtained when the measurements are performed using the DSP clock rather than an independent clock or one derived from the transmitter. Thus measurements can be made under more realistic conditions, including frequency offset and intentional SJ.

Embodiments of the present disclosure provide an on-chip at-speed measurement system for evaluating the impairments of a received signal in an asynchronous SERDES system, by chiefly using DSP circuitry that already exists as part of the receiver. It is therefore lower cost and easier to use and more accurate than known approaches.

Most known approaches involve the sweeping of some analog voltage threshold and applying it to the signal under investigation. The threshold is swept, and the histogram bin counters are incremented if the signal amplitude crosses the set threshold.

Embodiments of the present disclosure advantageously provide an additional, or dual, use of circuitry that is used for normal operation. Signals can be analyzed after an ADC and/or after or within a receiver DSP. Amplitude values can be obtained across the baud interval by controlling the timing of the ADC sampling, or by controlling the index of the DSP interpolator. Moreover, resulting amplitude values can then be binned per the obtained amplitude, and not per an amplitude crossing.

Before discussing details of embodiments of the present disclosure, certain known patent references will be contrasted with the embodiments described herein.

U.S. Pat. No. 7,957,923 discloses jitter measurement that involves an edge detecting circuit and an amplitude threshold circuit applied to the analog signal. In an embodiment of the present disclosure there is no analog edge detection.

In eye diagram determination disclosed in U.S. Pat. No. 7,822,110, the digital communications link includes a plurality of lanes through which the transmitter is coupled to the receiver. During an operating mode of the digital communications link and during otherwise normal system operation, the service processor (a) switches a selected one of the plurality of lanes from the operating mode to a test mode, (b) performs an eye scan of the selected lane. In embodiments of the present disclosure there is no need for a plurality of links, one link suffices.

Also, in the '110 patent, the receiver is configured to apply a high voltage threshold, and low voltage threshold conveyed from a processor. In embodiments of the present disclosure no threshold is conveyed from a processor or controller. The interpolated or sampled amplitude at the desired phase of the baud interval is collected for histogram processing.

In eye diagram generation disclosed in U.S. Pat. No. 7,684,478, a sequence of voltage samples of a transmitted data signal is generated by sampling, digitizing, and storing voltage samples of the data signal. The samples are asynchronously acquired. In embodiments of the present disclosure, and in contrast to the '478 patent, a DSP interpolator is employed, and measurements are performed at the output of the interpolator or at the output or internal nodes of an equalizer.

In synchronous signal diagram construction disclosed in U.S. Pat. No. 7,792,649, the data signal is edge-detected and asynchronously sampled (or alternatively a clock signal is latched). The data signal or a second signal is compared to a settable threshold voltage and sampled. Embodiments of the present disclosure do not sweep a settable threshold to determine amplitude statistics, and instead use an ADC which is also used for normal operation.

In eye diagram creation disclosed in U.S. Pat. No. 7,606,297, a binary data bit decision mechanism is applied with an upper and lower voltage threshold. Embodiments of the present disclosure do not sweep a voltage threshold and instead use an ADC which is also used for normal operation.

In U.S. Pat. No. 7,522,661, a probability density function eye diagram and a Bit Error Rate eye array are produced by convolving a two-dimensional PDF array of a correlated waveform record of a data pattern under test and a statistically correct two-dimensional uncorrelated PDF array of the jitter and noise in the data pattern under test. Embodiments of the present disclosure do not convolve received signals, rather they collect received amplitude samples.

FIG. 1 illustrates a known approach to data and timing recovery in a SERDES system, with an external jitter evaluation device. The signal from the line is sampled by an ADC 10 and then processed by an interpolator 12, or DSP interpolator, to obtain samples at the baud center and at the baud edge. A DSP timing recovery 14 calculates and updates interpolation indices for the interpolator 12. An optional equalizer 16 is applied before deciding on the value of the data bit at the baud center. A typical digital timing recovery circuit such as the Gardner timing recovery requires two samples per baud, one around the baud center and one around the baud edge. During tests, an optional pseudo random bit sequence (PRBS) checker 18, or other data bit processing, receives the recovered data bits from the DSP equalizer and data recovery 16 to check the recovered data bits for errors.

As is well known in the art, the interpolator 12 is supplied with an interpolation index which signifies which intermediate points of its input waveform are to be calculated, given typically only 2, 3 or 4 points per baud. Such an interpolator 12 typically supports a granularity of 10 to 16 positions per baud. The interpolator 12 may be based on a combination of low pass filter interpolation and linear or higher-order interpolation. For the Gardner timing recovery, two amplitudes are calculated. They can be jointly calculated for two completely independent interpolation indices, or one independent index may signify the baud center while the baud edge is calculated using the independent index for the baud center with a half0baud offset applied to it.

In block based SERDES systems, a burst of samples from the ADC 10 are provided in parallel. For instance, a system for a line rate of 6 Gbps may operate at 8 bits per block and a DSP clock of 750 MHz. Thus the interpolator 12 computes 8 distinct amplitude values for the 8 baud centers and 8 distinct edge values for the baud edges. Additional control and calculations ensure continuity from block to block. The block of data is then processed by the timing recovery 14 to calculate an updated interpolation index for a next block.

In alternative known approaches (not shown), the external jitter measurement eye diagram captures are performed using captured data from within the device. The device holds short bursts of copies of signal samples at the ADC output which are then redirected to a device output to be processed outside the device. Circuitry and processors external to the device process the redirected data. In order to reduce the interface speed for the redirected signal, and to reduce the processing speed of the external circuitry, bursts of sub-sets of the signal data are captured rather than the continuous signal. This means that interpolated samples of the received signal are saved to local memory within the SERDES ASIC, at speed, so as to record a temporal fragment of the signal. Then this fragment is exported from the SERDES ASIC to a different device for processing. This export occurs through a low rate interface, at a data rate that is much lower than the baud rate. As a result, the captured fragments only account for small fractions of the total length of the received signal. This implies that statistical measurements using short fragments take many times longer than when the signal itself is evaluated at speed. Moreover, it requires use of an additional low rate interface plus additional external DSP processing to mirror the internal DSP.

A consequential drawback of operating on a sub-set of the data is that the measurement duration can be very long in order to achieve a representation of the impairments at low operating BERs. For instance, a system designed to reliably measure jitter measurements and eye diagrams at a BER of $10^{-12}$ must collect $10^{14}$ or more bits of data per measurement. If the interface only allows the capture and processing of data at a Kilobit rate, and the eye is to be characterized at 10 or more timing points, the measurement time becomes prohibitively large.

Figure 2:
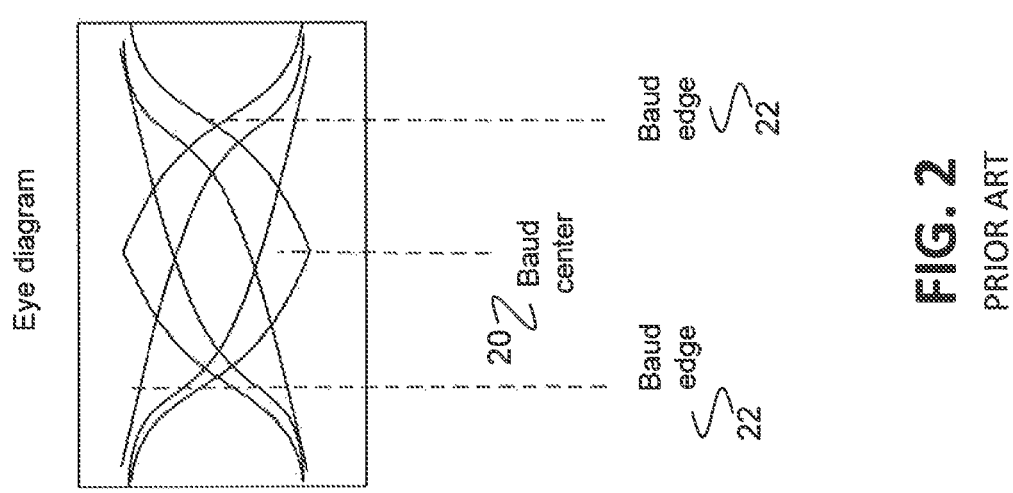
FIG. 2 illustrates an eye diagram produced in accordance with known approaches.

FIG. 2 illustrates an eye diagram produced in accordance with known approaches. In this eye diagram, normal sampling for data and timing recovery is performed at the baud center 20 and at the baud edges 22. In known approaches, the jitter measurements and eye diagram captures are performed by external measurement equipment, as shown in FIG. 1, with probes at the input to the SERDES device.

Figure 4:
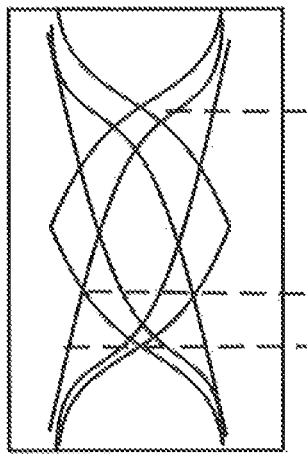
FIG. 4 illustrates an eye diagram produced in accordance with an offset data sampling embodiment of the present disclosure.
Figure 3:
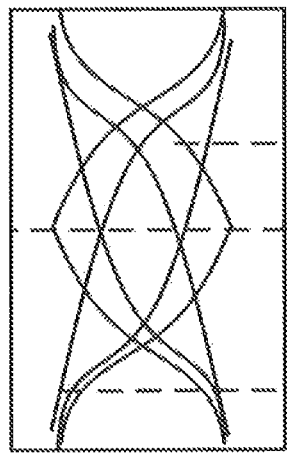
FIG. 3 illustrates an eye diagram produced in accordance with an offset timing sampling embodiment of the present disclosure.

FIGS. 3 and 4 illustrate eye diagrams produced in accordance with two embodiments of the present disclosure. In these embodiments, either the baud center sampling or the baud edge sampling is offset. For example, if the sampling is intentionally performed a little to the left of center, this results in errors that can be plotted as an error rate curve. The amount by which it is possible to move away from center, either to the left or to the right, until errors are produced provides an indication of the available error margin.

FIG. 3 illustrates an eye diagram produced in accordance with an embodiment of the present disclosure using offset timing sampling. In FIG. 3, samples at the baud center 20 are taken in a similar manner to known approaches. However, sampling that is normally performed at the baud edges is offset and instead sampled at offset baud edge eye sample locations 32, as will be discussed in greater detail below. In this embodiment, timing recovery can be performed, as well as producing eye diagrams and bathtub curves.

FIG. 4 illustrates an eye diagram produced in accordance with another embodiment of the present disclosure using offset data sampling. In FIG. 4, samples are taken at the baud edges 22 in a manner similar to known approaches, but the sampling normally performed at the baud center is offset and instead sampled at an offset baud center eye sample location 40, to sweep the eye. In this embodiment, the system cannot be used in normal data communication mode while these diagnostics are performed.

Figure 5:
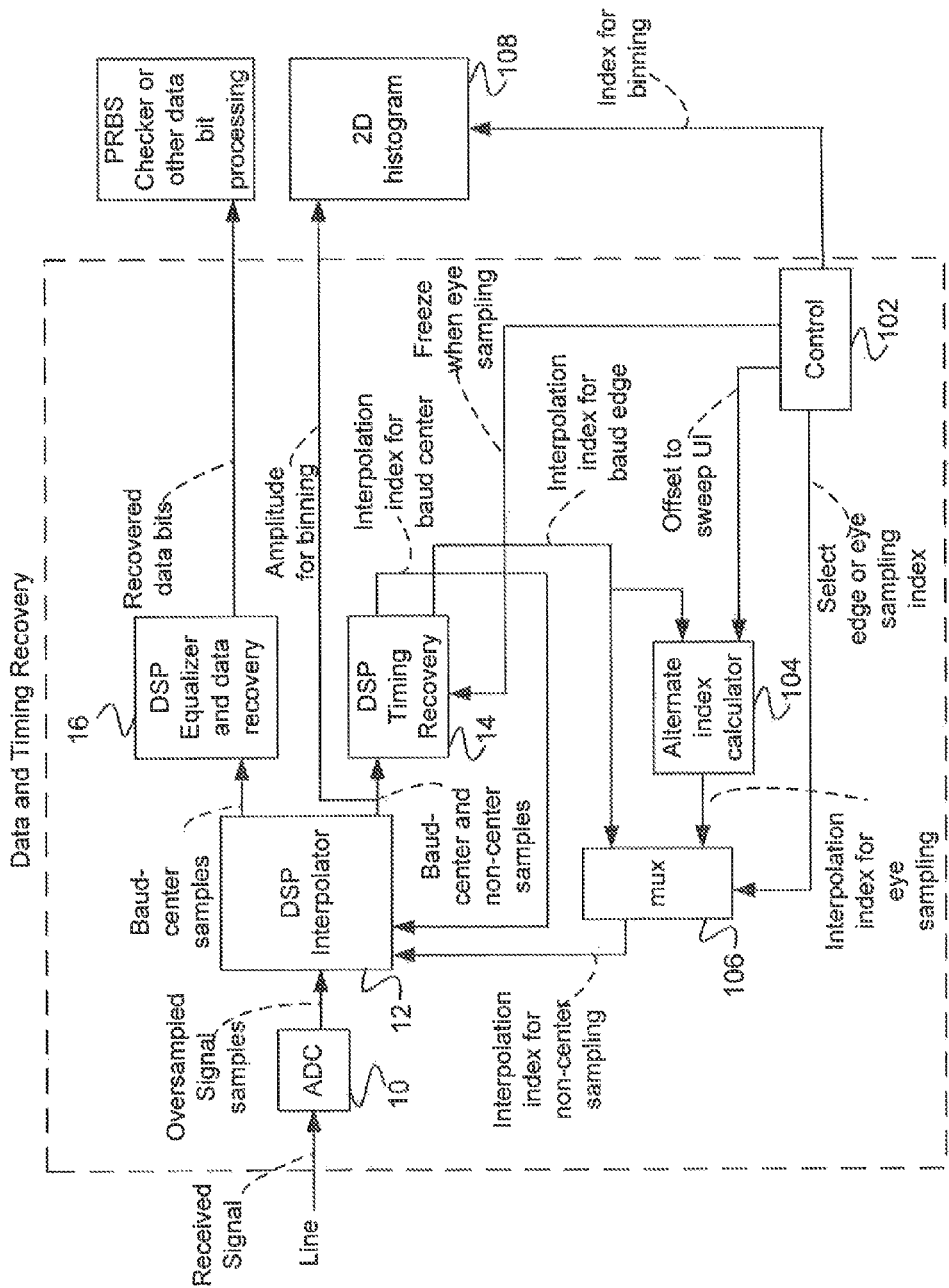
FIG. 5 illustrates a data and timing recovery system according to an embodiment of the present disclosure using alternate edge sampling.

FIG. 5 illustrates a data and timing recovery system according to an embodiment of the present disclosure using alternate edge sampling. In the embodiment FIG. 5, the SERDES system includes additional circuitry to use the interpolator 12 for dual purposes. In embodiments of the present disclosure, in addition to its original purpose of calculating baud edge and baud center amplitudes, the interpolator 12 is also employed to calculate amplitudes at intermediate eye positions for jitter measurements, bath-tub BER measurements and eye diagrams. The eye diagram is obtained using a two dimensional histogram of signal amplitude versus position in the baud interval. The bath-tub BER is obtained by measuring the BER when a set timing offset is applied. Embodiments of the present disclosure use the interpolator 12 to sample to the left or right of center (or to the left or right of a baud edge) to fill in the information, by sweeping the index, and building up the values used to produce an eye diagram.

In FIG. 5, similar to FIG. 1, the signal from the line is sampled by the ADC 10 and then processed by the interpolator 12 to obtain samples at the baud center and centers at the baud edge. The DSP timing recovery 14 calculates and updates interpolation indices for the interpolator. More specifically, the interpolator 12 employs independent interpolation indices, one for the baud centers and one for the baud edges. Typically the two represent a fixed distance of half the baud duration.

In the embodiment of FIG. 5, an additional control circuit 102 is provided on-chip, within the DSP timing recovery circuitry, or system. The control circuit 102 is configured to override the interpolation index intermittently for short durations of time. In an embodiment, the interpolation index is modified or offset during those short durations of time, which can be referred to as a time of controlled override.

In an embodiment, during the controlled override, the interpolation index for the baud edge is replaced by an interpolation index for eye sampling. In an example embodiment, the interpolation index for the baud edge is modified such that it becomes an offset interpolation index for a non-baud-center output. The interpolation for the baud center is maintained. The baud-center output of the interpolator then still contains an amplitude for recovering the data bit, but the non-baud-center output contains an amplitude for eye measurements and not for timing recovery. In order to maintain correct timing during and after the override, the timing recovery and control is suspended, or frozen, so as to not be affected by interpolated amplitudes that in fact do not apply for timing recovery.

In an example alternate edge sampling embodiment, the control circuit 102 maintains an internal and configurable counter that signifies the start and end of an override in terms of block counts, and that starts overrides intermittently. The time between overrides is used to allow the timing recovery to maintain synchronization with the incoming signal.

In an embodiment, the offset to the interpolation index is applied in relation to properties of the received signal. In an example embodiment, the offset to the interpolation index is applied at a selected frequency and for a selected duration based on synchronization parameters of the received signal. In another example embodiment, the duration and intermittency of the override are limited by the synchronization requirements for the incoming signal. If large amounts of low frequency SJ and/or frequency offset are to be tracked by the receiver, in an embodiment the override duration is kept sufficiently short and infrequent, which lengthens the measurement.

In an embodiment, during the override, the interpolation index for eye measurements is swept across the baud interval. This can be accomplished by adding a sweep offset to the interpolation index for the baud edge. In an example embodiment, the thus obtained interpolation index for eye sampling is applied to the interpolator 12 instead of the interpolation index for the baud edge.

Also during the override, in an embodiment the control circuit 102 suspends, or freezes, the timing recovery to maintain timing in absence of a reliable baud-edge amplitude. In an embodiment, the control circuit 102 provides intermittent offsetting.

The control circuit 102 is in communication with DSP interpolator and timing recovery circuitry, including the DSP interpolator 12 and the DSP timing recovery 14. In an embodiment, the control circuit 102 is in communication with the DSP timing recovery 14 to suspend, or freeze, the timing recovery when performing eye sampling. In an example embodiment, the control unit 102 is configured to switch the DSP interpolator and timing recovery circuitry between a first mode and a second mode, the first mode being a data and timing recovery mode, and the second mode being a diagnostic mode. In the data and timing recovery mode, baud-center samples are provided for data recovery and edge samples are provided for timing recovery. In the diagnostic mode, a temporary offset is applied to the interpolation index to produce offset interpolated samples between the baud center and baud edge. The offset interpolated samples enable measurement of signal impairments within the DSP based circuit.

An alternate index calculator 104 is in communication with the control circuit 102 to receive the temporary offset. The alternate index calculator 104 is also in communication with the DSP timing recovery circuitry 14 to receive the interpolation index. The alternate index calculator 104 is configured to generate the offset interpolated samples based on the temporary offset and the interpolation index.

A multiplexer 106 is in communication with the control circuit 102 to receive a selection signal. The multiplexer 106 is also in communication with the alternate index calculator 104 to receive the offset interpolated samples. The multiplexer 106 is further in communication with the DSP interpolator 12 to output an offset interpolation index in response to the selection signal. The interpolation index for baud edge/non-center sampling does not go straight to the interpolator 12, but rather to the multiplexer 106 via which a value is added to the baud edge index to intentionally offset the value. The offset is added to sweep the bit period, or unit interval. The output of the multiplexer 106 in FIG. 5 is the interpolation index for non-center sampling, or for offset edge sampling.

In an embodiment, the control circuit 102 also signifies to a 2D histogram unit 108 that the interpolator output is to be processed by the 2D histogram unit 208, and supplies a bin index corresponding to the interpolation index. The 2D histogram unit 208 collects the calculated amplitude when the interpolator index is overridden. In an embodiment, the 2D histogram unit 208 is used for counting, with each bin being used for a separate count. In an example embodiment, one counter circuit increments the value in any chosen bin. For example, if there is a horizontal resolution of $1/16$ interval, and 10 amplitude values, an exemplary suitable 2D histogram unit has 160 bins (e.g. each is a 32-bit registers) and one 32-bit adder.

Usually it suffices to sweep over one unit interval (UI), whereby the sweep is centered around the baud center, in steps of $1/16$ UI. The sweep can be performed in sections. In an example embodiment, during a first override, the sweep index is set to one end of the interval while the amplitudes are binned for a 2D histogram, at a bin index equalling the sweep index. During a next override, the sweep index is changed by $1/16$ UI ($1/16$ UI up, or $1/16$ UI down depending on the sweep direction) and the amplitudes are binned at a bin index equalling the new sweep index. This continues until the full interval is swept.

As is well known in the art of statistics, the 2D histogram is a set of M by N counters, where M determines the granularity of the binned amplitude, e.g. 10 bits, and N is the number of bins, e.g. 16. The amplitude to be binned is mapped to the closest available binning amplitude, and the counter for that binning amplitude and for the applied bin index is incremented.

The dwell time at a specific sweep index value determines how much data is collected at the index. Usually the desired dwell time exceeds the duration of one override by K times, perhaps K=100× to 1000× or more, in which case the sweep index is only changed once every K overrides. Alternatively, the dwell time is kept equal to the override time and the sweep is repeated K times for one measurement.

In an embodiment, at regular intervals, after sufficient samples are binned but before the counters saturate, the histogram is read out to an external processor to process the data for calculating jitter, bath-tub BER and eye diagrams. Then the histogram counters are cleared and a new measurement can be performed. While some external processing is used to provide these calculations, the associated measurements were performed on-chip and at-speed, in contrast with known approaches.

Notably, the external processing occurs infrequently and can be completed by a GPU (General Processing Unit) and firmware outside the DSP SERDES system. The histogram data is processed at a rate many times below the data rate, whereas the 2D histogram data is captured at a rate at or near the line rate.

According to an example embodiment of the present disclosure, the eye data is collected using the existing DSP interpolator 12. According to an example embodiment, the eye data is collected without interrupting the line. The override intervals can be kept infrequent enough or short enough depending on the timing recovery requirements, to allow the data communications to continue while simultaneously measurements are being performed.

In an example embodiment, data for the eye diagram are collected and accumulated during the override; bit error counts for the bath-tub BER are collected and accumulated during the override; and bit error counts for the BER at normal operation are collected and accumulated outside the override.

Thus live data communications links can be tested and evaluated using no additional line-rate hardware, yielding an accurate measurement of the line in terms of all line impairments including analog and DSP SERDES system impairments. Moreover, there is no need to control and adjust threshold levels in the analog samplers, since the system processes digitized amplitude values from the ADC without affecting thresholds in the ADC.

Figure 6:
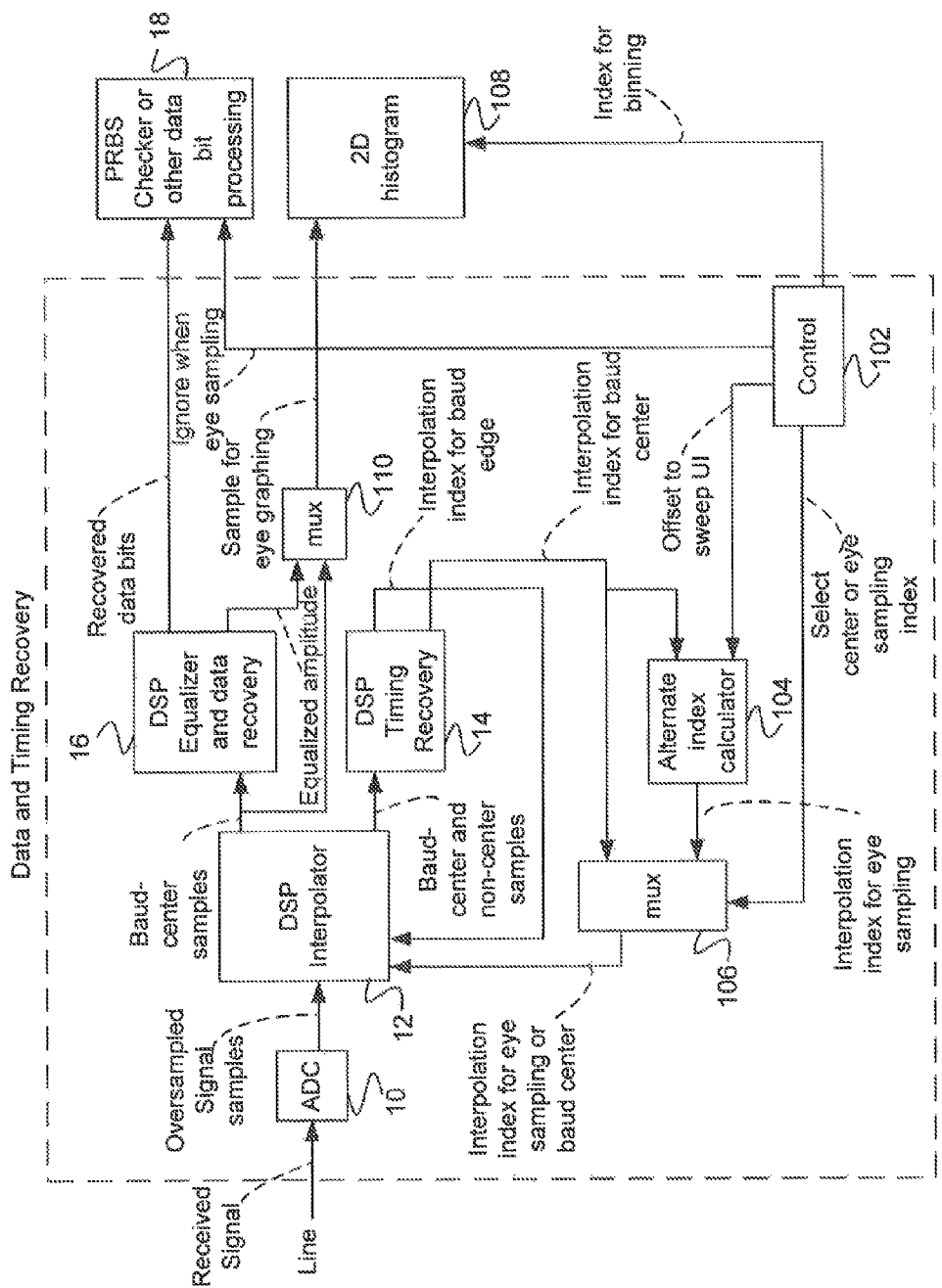
FIG. 6 illustrates a data and timing recovery system according to another embodiment of the present disclosure using alternate data sampling.

FIG. 6 illustrates a data and timing recovery system according to another embodiment of the present disclosure using alternate data sampling. In the alternate data sampling embodiment of FIG. 6, the override is applied to the baud index instead of the timing index. In this case the DSP timing recovery circuit 14 operates without interruptions during the override. Instead, the data recovery portion of the DSP equalizer and data recovery 16 is configured to account for possibly incorrect recovery when the sweep index is off-center.

In FIG. 6, the output of the multiplexer 106 is the interpolation index for center sampling. The interpolation index for baud edge sampling goes straight to the interpolator 12. The interpolation index for baud center is overwritten with the defined output from the control unit 102.

In order to perform BER measurements, the operation of the timing recovery in the receiver is required due to the presence of timing offsets, including frequency offsets. In an example embodiment, the jitter measurements are optionally performed during BER measurement tests. To this end, the desired intentional timing offset is applied intermittently for several baud, and then the offset is muted for several baud. When the non-zero offset is applied, the BER measurement is suspended. When no offset is applied, the BER measurement continues. Timing is tracked and data bit errors are counted when the offset is zero. Timing is frozen and data bit error counting is suspended when a controlled offset is applied for jitter measurement. The PRBS checker 18 receives a signal from the control circuit 102 to suspend, or ignore, the received recovered data bits when sampling the eye with an intentional offset. The 2D histogram may be based on amplitude values before or after equalization. Depending on the desired test, a multiplexer 110 selects between the output of the interpolator and the equalized amplitude before the data bit decision The PRBS checker 18 receives a signal from the control circuit 102 to suspend, or ignore, the received recovered data bits when eye sampling, or during a diagnostic mode. The multiplexer 110 receives recovered data bits from the equalizer 16 and baud center samples from the interpolator 12, and outputs a sample for eye graphing to the 2D histogram unit 108. The multiplexer 110 facilitates creation of the 2D histogram after equalization, which is only possible on-chip.

An advantage of this embodiment is that the measurement of the impairments can occur under more stringent timing requirements (more frequency offset, higher SJ amplitude, and/or Spread Spectrum Clocking) than in the foregoing embodiment, since the timing recovery 14 remains in continual operation. A further advantage is that the measurements can be performed at any stage of the data recovery process. This includes measuring at the interpolator output, as in the foregoing example, or at internal amplitude nodes of the optional DSP equalizer 16 (e.g., after the FFE, after the DFE, after some or all taps), or at the output of the equalizer 16 just before the data decision is made.

Decision aided equalization schemes, such as the DFE, require generally correct recovery of the data bits. In this embodiment the output of the interpolator 12 for the baud center is used to obtain the amplitudes for measurements, and thus it is possible that the data recovery is incorrect during parts of the sweep, especially when sweeping at or near the baud edges. To this end, a correctly synchronized reference data generator (not shown) within the receiving SERDES can be employed to provide reference data bits to the equalizer and the timing recovery. Under test conditions the transmitter is configured to send a known pseudo-random binary sequence (PRBS). The sequence generator is then a PRBS generator which is easily matched and synchronized to, yielding reliable eye measurements also at the DFE output.

Moreover, the PRBS checker 18 may be used to perform data aided equalization during jitter measurements in the event of high bit error rates due to large intentional sampling offsets. Thus the PRBS data sequence is synchronized with the recovered data sequence at the DFE output and the data bits from the PRBS is used, rather than the recovered data bits (the decisions), for data bit feedback in the DFE.

While some embodiments of the present disclosure are applied to a DSP based asynchronous system, other embodiments of the present disclosure are applied to a synchronous system.

Figure 7:
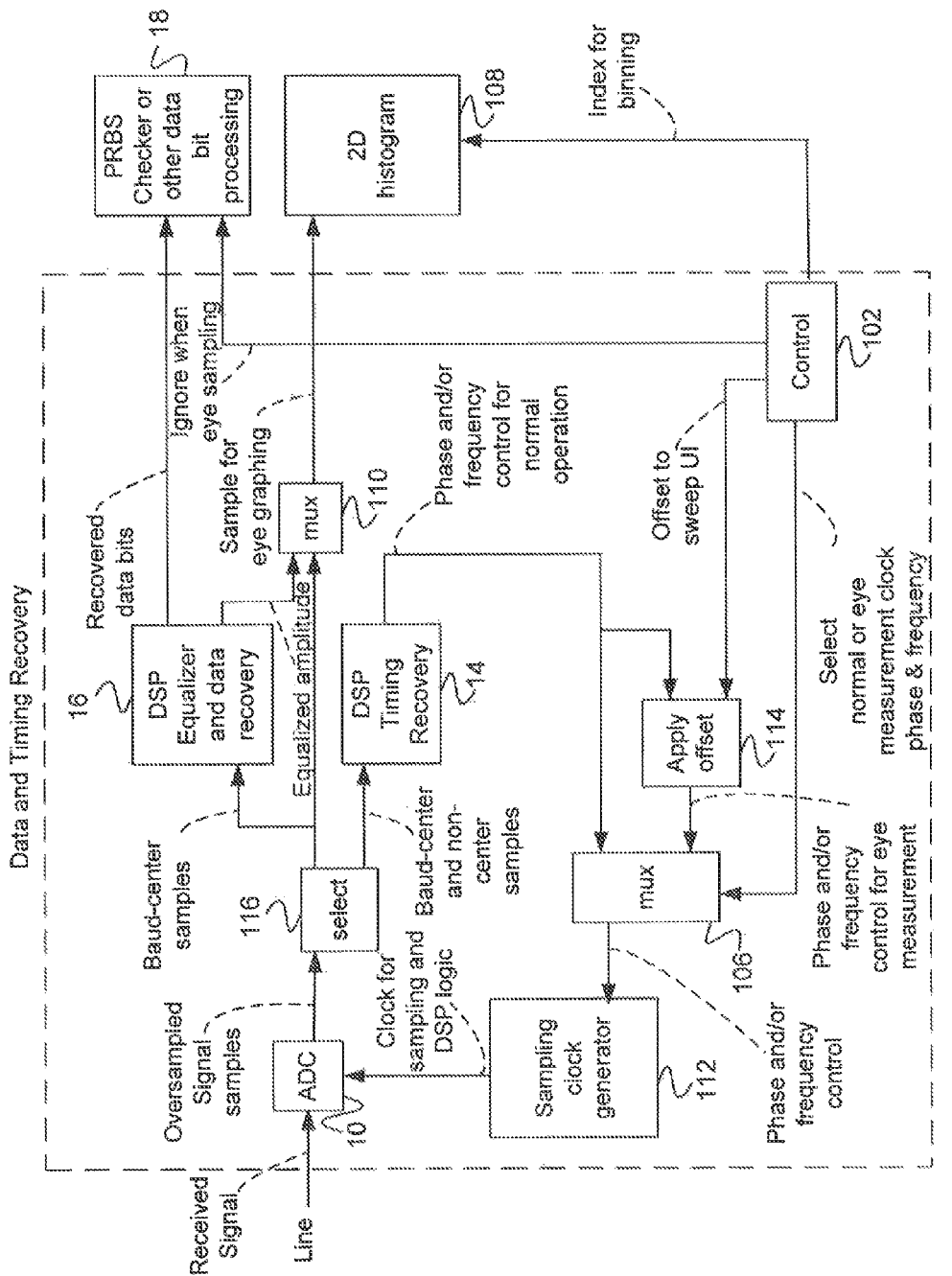
FIG. 7 illustrates a synchronous data and timing recovery system according to an embodiment of the present disclosure.

FIG. 7 illustrates a synchronous data and timing recovery system according to an embodiment of the present disclosure. In a synchronous system such as in the embodiment illustrated in FIG. 7, the sampling clock of the ADC is synchronized to the baud intervals of the received signal.

Synchronous SERDES systems employ a synchronized approach, where the ADC sampling clock is adjusted to be phase locked with the baud intervals of the received signal. In DSP based systems, the timing adjustments are calculated by the timing recovery unit 14 and a timing control signal is supplied by the DSP to a sampling clock generator 112 for the ADC 10. There is thus no need for DSP interpolation in such an embodiment.

When adapting previously described aspects of embodiments of the present disclosure to such synchronous systems, the override is applied using an offset block 114 to the timing control signal rather than the interpolation index. In an example embodiment, the offset block 114 does not calculate the offset itself, but rather adds the offset to the timing control signal, causing the sampler to sample at a desired offset. In one implementation of such an example embodiment, the control block 102 calculates the offset, for example by sweeping the offset signal from one extreme to another. A select block 116 extracts the edge and non-edge samples from the stream of samples obtained from the ADC 10. Data recovery is based on the baud center samples, and hence are provided to the DSP equalizer and data recovery 16 as well as the multiplexer 110. On the other hand, timing recovery is based on baud edge and baud center samples. Therefore, all samples are selected from the ADC 10 and provided to the DSP timing recovery 14 at the respective inputs (not shown) for the baud-center and baud-edge.

In an example embodiment, for a continuous received signal x(t), the ADC 10 may be based on temporal samples $x(0+t0)\ x(T+t0) x(2T+t0)\ldots x(kT+t0)$ etc., where 1/T is the oversampled sampling rate; and t0 is the timing phase alignment such that the even samples are the baud center samples and the odd samples are the baud-edge samples. For instance in a 6 Gbaud link, a 2× oversampled ADC samples effectively at 12 GHz, and $T=\frac{1}{12}$ GHz. In a parallel implementation based on 8-baud blocks, this would require 16 individual ADCs, each operating at 750 MHz. It should be noted that the odd/even choice is generally arbitrary, and the design may instead use even samples for baud edge and odd samples for baud center.

Compared to the interpolation based system, the delays in the control path to the clock generator, and the ADC path to the DSP, typically require a slightly lower override frequency and shorter override durations, which implies a slightly longer measurement time. Moreover, it is usually not possible to independently control the edge timing and the baud timing, as both are determined from the same ADC clock.

Therefore, in an embodiment, the timing recovery is suspended, or frozen, during the override. Moreover, in an embodiment, for measurements at the output of a DFE, reference data is supplied as well.

In the embodiment of FIG. 7, the timing recovery tunes the ADC clock frequency and phase to the baud frequency and phase of the received signal. The system adds the sweep offset to the control signal to move the sampling phase a little to the left or right from the ideal baud center and baud edge positions. The output of the ADC 10 is then used to create the eye diagram.

The various embodiments described herein can be employed in, or with, a number of exemplary implementations. Example embodiments of the present disclosure are implemented within the digital logic of the DSP, during normal operation, using DSP circuitry already in use for normal operation. The DSP performs the measurements and the histogram collects the measurements. In an example embodiment, further processing for instance, to draw BER curves or to draw eye diagrams or to calculate horizontal jitter and vertical fluctuation, is external to the DSP, and is performed by a GPU and firmware or diagnostic software. In another example embodiment, the further processing is included within additional circuitry in the DSP, whereby the additional histogram processing is performed by the DSP system and not an external GPU.

An example embodiment of the present disclosure is used in, and applies to, SERDES devices for electrical lines used in data communications at any rate.

An example embodiment of the present disclosure is used in, and applies to, NRZ systems (2 level keying) as well as higher order PAM systems (4 level keying) as long as the signal is ultimately a baseband waveform obtained from sampling and/or interpolation.

An example embodiment of the present disclosure is used in, and applies to, reference laboratory measurement equipment to perform at-speed protocol analysis as well as jitter measurements.

An example embodiment of the present disclosure is used in, and applies to, optical systems. In comparison to a system for electrical signals, the ADC is substituted for a simple on/off sampler sensing the presence or absence of light. The present measurement can be used to determine the horizontal opening at an interval resolution that is higher than provided by the sampling. For instance, embodiments of the present disclosure can be applied to an optical system operating at 2× baud synchronous sampling, to measure the horizontal eye opening at a resolution of 1/16 baud.

Advancements in data communications require transmissions at ever increasing data rates over ever more challenging communications channels. Evidence of this is the deployment of equipment supporting several standardized protocols. An example of this is SATA (Serial Advanced Technology Attachment), with data rates up to 6 Gbps, with release 3.0 since May 2009, aimed at improving quality of service for video streaming in computers and notebooks. A further example is SAS (Serial Attached SCSI), with rates up to 6 Gbps for server backplanes. Other examples include communications systems for PON (Passive Optical Networks), which carry data over optical and electrical channels, as well as FibreChannel, InfiniBand, and USB.

With increasing data rates, the electrical and optical distortions, as well as other sources of signal impairments, become more challenging to overcome. To this end, data and clock recovery circuits use increasingly sophisticated receiver schemes, which include analog and digital equalization, digital timing recovery, and asynchronous systems. At these increased rates, the most common implementation is an ASIC.

According to embodiments of the present disclosure, it is advantageous for design and test to obtain detailed measurements of the properties of the received signal at various points in the decoder inside the ASIC. This reveals the impairments and quality of the signal at the input ad output of the various decoder stages.

With a built-in measurement ability according to embodiments of the present disclosure, eye diagrams and jitter measurements are readily available when poor performance requires deeper investigation of the received signal. Such measurement can then be performed at speed without additional costly and bulky equipment.

In many applications the SERDES power consumption and ASIC die area are constrained, and it is not desirable to add significant amounts of DSP circuitry to perform such measurements. It is therefore advantageous to implement the measurement using only little additional circuitry, such as according to embodiments of the present disclosure.

In the preceding description, for purposes of explanation, numerous details are set forth in order to provide a thorough understanding of the embodiments. However, it will be apparent to one skilled in the art that these specific details are not required. In other instances, well-known electrical structures and circuits are shown in block diagram form in order not to obscure the understanding. For example, specific details are not provided as to whether the embodiments described herein are implemented as a software routine, hardware circuit, firmware, or a combination thereof.

Embodiments of the disclosure can be represented as a computer program product stored in a machine-readable medium (also referred to as a computer-readable medium, a processor-readable medium, or a computer usable medium having a computer-readable program code embodied therein). The machine-readable medium can be any suitable tangible, non-transitory medium, including magnetic, optical, or electrical storage medium including a diskette, compact disk read only memory (CD-ROM), memory device (volatile or non-volatile), or similar storage mechanism. The machine-readable medium can contain various sets of instructions, code sequences, configuration information, or other data, which, when executed, cause a processor to perform steps in a method according to an embodiment of the disclosure. Those of ordinary skill in the art will appreciate that other instructions and operations necessary to implement the described implementations can also be stored on the machine-readable medium. The instructions stored on the machine-readable medium can be executed by a processor or other suitable processing device, and can interface with circuitry to perform the described tasks.

The above-described embodiments are intended to be examples only. Alterations, modifications and variations can be effected to the particular embodiments by those of skill in the art without departing from the scope, which is defined solely by the claims appended hereto.

What is claimed is:

1. A method for measuring signal impairments in a received signal in an asynchronous Digital Signal Processing (DSP) based data and timing recovery circuit, comprising:
   generating an offset value;
   applying the offset value to an interpolation index to obtain, at a baud speed of the received signal, offset interpolated samples between a baud centre and a baud edge;
   processing the offset interpolated samples at a processing rate lower than the baud speed of the received signal; and
   determining, within the DSP based data and timing recovery circuit, signal characteristics in the received signal based on the offset interpolated samples.

2. The method of claim 1, wherein the signal characteristics comprise signal amplitude.

3. The method of claim 1, wherein applying the offset to the interpolation index comprises offsetting a baud-edge sampling, while maintaining a baud-center sampling without offset.

4. The method of claim 1, wherein applying the offset to the interpolation index comprises offsetting a baud-center sampling, while maintaining a baud-edge sampling without offset.

5. The method of claim 1 further comprising:
   collecting two dimensional histogram statistics of the interpolated samples, to obtain stored offset interpolated samples; and
   processing the stored offset interpolated samples at the processing rate lower than the baud speed of the received signal.

6. The method of claim 1, further comprising:
   generating an eye diagram from the received signal and the stored offset interpolated samples for measuring signal impairments in the received signal.

7. The method of claim 6, wherein the eye diagram is generated using the received signal prior to equalization.

8. The method of claim 6, wherein the eye diagram is generated using the received signal after equalization.

9. The method of claim 1, wherein measuring signal impairments includes calculating signal jitter and bath-tub bit error rates.

10. The method of claim 1, wherein the offset to the interpolation index is applied in relation to properties of the received signal.

11. The method of claim 10, wherein the offset to the interpolation index is applied at a selected frequency and for a selected duration based on synchronization parameters of the received signal.

12. A method for measuring signal impairments in a received signal in a synchronous Digital Signal Processing (DSP) based data and timing recovery circuit, comprising:
   generating an offset value;

applying the offset value to a timing control signal to obtain, at a baud speed of the received signal, offset timing control signals between a baud centre and a baud edge;

processing the offset timing control signals at a processing rate lower than the baud speed of the received signal; and determining, within the DSP based data and timing recovery circuit, signal impairments in the received signal based on the offset timing control signals.

13. A non-transitory computer-readable medium storing statements and instructions for execution by a processor to perform a method for measuring signal impairments in a received signal in an asynchronous Digital Signal Processing (DSP) based data and timing recovery circuit, the method comprising:

generating an offset value;

applying the offset value to an interpolation index to obtain, at a baud speed of the received signal, offset interpolated samples between a baud centre and a baud edge;

processing the offset interpolated samples at a processing rate lower than the baud speed of the received signal; and determining, within the DSP based data and timing recovery circuit, signal characteristics in the received signal based on the offset interpolated samples.

14. The non-transitory computer-readable medium of claim 13, wherein the signal characteristics comprise signal amplitude.

15. The non-transitory computer-readable medium of claim 13, wherein applying the offset to the interpolation index comprises offsetting a baud-edge sampling, while maintaining a baud-center sampling without offset.

16. The non-transitory computer-readable medium of claim 13, wherein applying the offset to the interpolation index comprises offsetting a baud-center sampling, while maintaining a baud-edge sampling without offset.

17. The non-transitory computer-readable medium of claim 13, wherein the method further comprises:

generating an eye diagram from the received signal and the offset interpolated samples for measuring signal impairments in the received signal.

18. The non-transitory computer-readable medium of claim 13, wherein the offset to the interpolation index is applied in relation to properties of the received signal.

* * * * *